(12) United States Patent
Bourrieres et al.

(10) Patent No.: US 6,533,160 B1
(45) Date of Patent: Mar. 18, 2003

(54) DEVICE FOR PROVIDING BALLS OR PREFORMS FOR MAKING FLIP-CHIP CONNECTIONS

(75) Inventors: Francis Bourrieres, Montauban (FR); Clement Kaiser, Montauban (FR)

(73) Assignee: Societe Novatec S.A., Montrauban (FR)

( * ) Notice: Subject to any disclaimer, the term of this patent is extended or adjusted under 35 U.S.C. 154(b) by 0 days.

(21) Appl. No.: 09/830,201

(22) PCT Filed: Oct. 27, 1999

(86) PCT No.: PCT/FR99/02613

§ 371 (c)(1),
(2), (4) Date: Apr. 23, 2001

(87) PCT Pub. No.: WO00/25358

PCT Pub. Date: May 4, 2000

(30) Foreign Application Priority Data

Oct. 27, 1998 (FR) .............................. 98 13424

(51) Int. Cl.[7] .......................... B23K 31/00; B23K 35/00
(52) U.S. Cl. .......................... 228/41; 228/245; 228/246
(58) Field of Search ........................... 228/41, 245, 246

(56) References Cited

U.S. PATENT DOCUMENTS 5,479,703 A    1/1996  Desai et al. .................. 29/852
5,849,132 A   12/1998  Chiu .......................... 156/298
6,186,389 B1 *  2/2001  Nakajima et al. .............. 228/41
6,253,992 B1 *  7/2001  Fjelstad ..................... 228/245
6,325,272 B1 * 12/2001  May et al. .................... 228/41

FOREIGN PATENT DOCUMENTS

| JP | 6007254    | 1/1994 |
| JP | 07-212023  | 8/1995 |
| JP | 9097793    | 4/1997 |
| WO | 98/43307   | 1/1998 |

* cited by examiner

*Primary Examiner*—M. Alexandra Elve
*Assistant Examiner*—Len Tran
(74) *Attorney, Agent, or Firm*—Vidas, Arrett & Steinkraus

(57) ABSTRACT

A device (14) for implementing a method for setting on a substrate (2) interconnecting balls or preforms (1) comprising the following phases: storing in bulk the preforms (1); seizing in ordered position the preforms (1) with an adapted gripping device (9); setting the preforms (1) on the substrate (2) with the gripping device (9). Said device (14) is characterized in that it consists of at least a matrix for storing the preforms, said matrix comprising a floor capable of acting as stop for the preforms when the matrix is being filled thereby enabling the implementation of a method whereby the passage from bulk storage to ordered storage is performed in masked time. The device is useful for incorporating or replacing balls in substrates of electronic components.

14 Claims, 10 Drawing Sheets

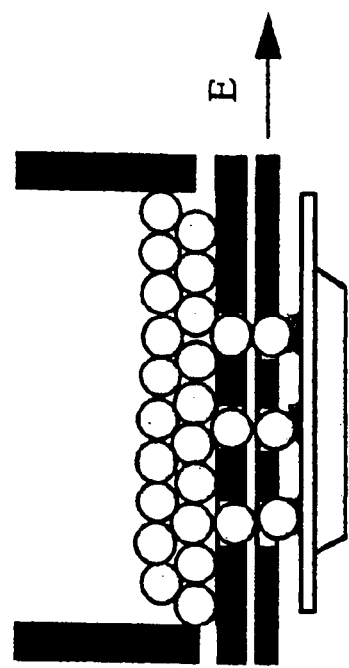
Fig 1
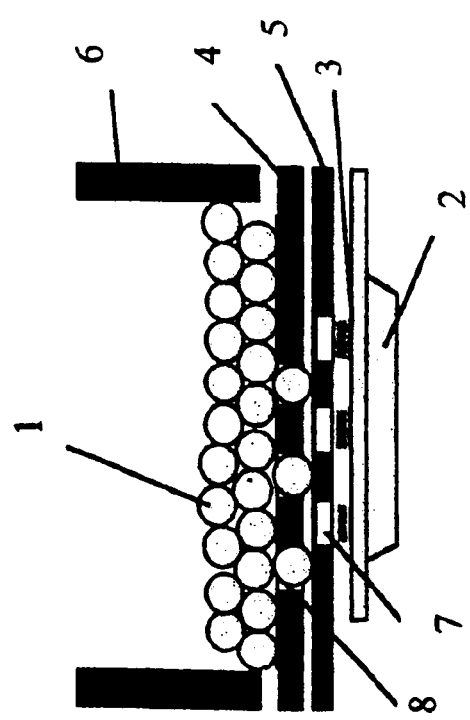
Fig 2
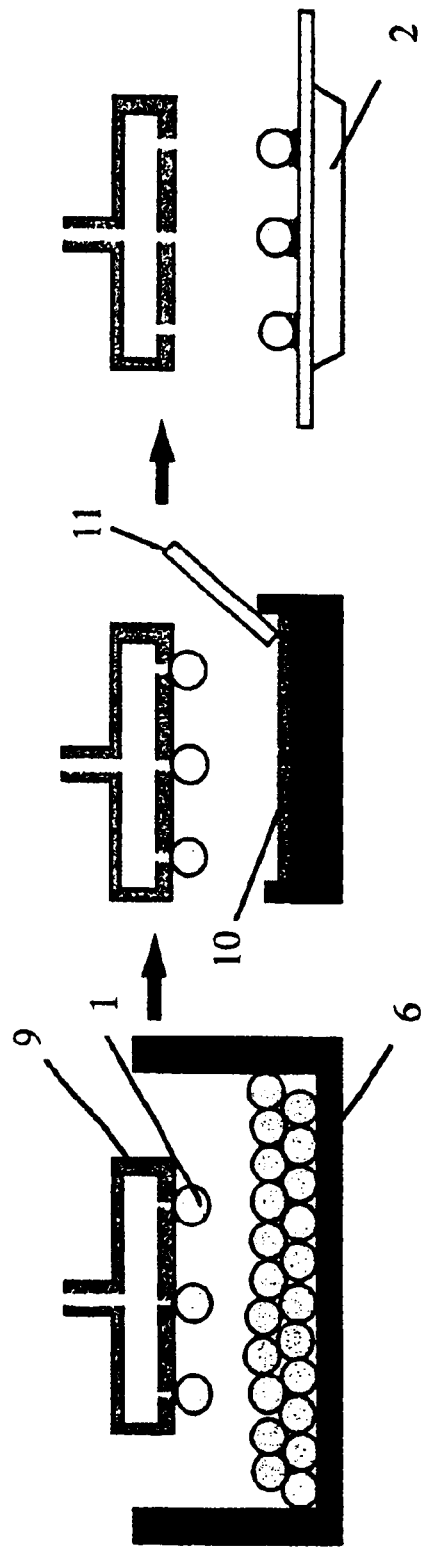

DEVICE FOR PROVIDING BALLS OR PREFORMS FOR MAKING FLIP-CHIP CONNECTIONS

FIELD OF APPLICATION OF THE INVENTION

This invention finds its application in the field of electronics for the manufacture or the repair of components having their inputs/outputs distributed over the bottom or the top surface of said component. The interconnections of these components consist of spherical caps generally made from spherical preforms or balls made of a lead-tin alloy.

DESCRIPTION OF THE PRIOR ART

Classically, the spherical caps constituting the interconnections are produced according to the following manufacturing sequence:
  Deposit of soldering cream or flux on the mounting lands arranged on the substrates or on the preforms,
  Transfer of the preforms onto the substrate,
  Reflowing in order to solder the preforms onto the mounting lands of the substrate made up by the component.

Generally, the first operation in the transfer phase consists in arranging the balls in orderly fashion in order to be able to deposit them collectively on the substrate, that is, to have one ball opposite each mounting land. Three types of techniques are used to arrange the balls to correspond with the layout of the mounting lands of the component or components:
  Parallel stencil technique: This technique consists in using two stencils that can be moved in relative motion to one another so that when the openings of the two stencils correspond, gravity causes the balls to fall onto the substrate placed underneath them, since the balls above are stored in bulk.
  Suction technique: This technique consists in sucking up the balls, which are arranged in bulk in a bin, by means of a gripping device. When all the available locations have sucked up a ball, these balls are transferred simultaneously by said gripping device onto said substrate.
  Gravity-filled cavities technique: This technique consists in filling cavities corresponding to the design of the substrate for the balls are to be incorporated. As soon as each cavity contains a ball, the transfer operation takes place.

All the preceding techniques have the same disadvantages, namely, the time cycle is too long because it is necessary for each cavity to contain a ball before proceeding with the transfer operation itself, but as this is done using a random arrangement of balls, the time required to arrange the balls is lengthy with respect to the complete cycle time.

Another disadvantage resides in the fact that the level of quality likely to be achieved by these devices is limited, since the probability of having a missing ball remains high and this requires the use of test devices (optical, vacuum sensor, electrical, etc.) in order to verify the presence of all the balls during and after the transfer phase, and consequently increases the cycle time and the complexity of the method for positioning the balls.

Another disadvantage resides in the fact that the excess balls or preforms that return to the storage module create by their motion tiny chips inside the module. These tiny chips could block the suction nozzles of the gripping device or be confused with a preform by the detectors. Furthermore, in order to improve gripping during suction, or in connection with the two other techniques, vibrations are applied to the bulk storage module.

These three techniques described above can be broken down into two method categories:
  On the one hand, direct modes in which the transfer operation is accomplished by a transfer apparatus such as a bulk storage module combined with a stencil distributing the preforms directly onto the substrate, or such as a storage device for preforms that passes over the storage cavities so that a preform is placed in each cavity, the substrate coming opposite the filled cavities so that the preforms adhere to the mounting lands provided for this purpose, and
  on the other hand, indirect modes, such as the technique using the suction gripping device described above that is inserted between the bulk storage module and the substrate. Thus, in the indirect process, the storage module does not constitute an element of a transfer module, but a module independent of the gripping module.

In order to improve the cycle times of the transfer phase, many processes and devices have been implemented in the prior art. These devices are adaptations of the so-called direct processes.

Thus, for example, a direct transfer device for preforms is described in international application WO 98/43307, this device consisting of a preform storage module combined with a substrate positioning module. One of the features of this transfer device is that a guidance and positioning mechanism is placed between the storage module and the positioning module so that when the transfer module is inverted, the first balls guided and positioned by the positioning module come into contact with the mounting lands provided on the substrate. Although this device solves the problem of positioning the balls with respect to the mounting lands, thereby simplifying the detection systems, the inversion operations and the planned vibrations mean that the tiny chip phenomenon is still present and is likely to be the cause of a faulty transfer. Additionally, the time gained is not particularly meaningful, more particularly because the preform positioning operation is not performed in hidden time but in series with the substrate depositing operation.

Another direct transfer device is described in the Japanese document No. 9-97793. This device consists of a preform storage module combined with a parallel stencil transfer module underneath which is positioned the substrate to receive the balls.

This transfer device is characterized in that a guidance and positioning mechanism for the preforms is inserted between the balls stored in bulk and the stencil transfer module. Although this insertion of a device solves part of the problems involved in conveying balls toward the transfer module, the problem of tiny chips persists as a result of the vibration applied to make the balls to drop (gravity, being the force that pushes the balls toward the stencils). Additionally, the time gained in the time cycle is not significant compared with the cycle time of a device using the parallel stencil technique. Over and above a certain cadence, all the balls do not fall into the cells because they suffer lateral stresses, which affects the quality.

An indirect transfer device is described in Japanese published application JP 07-212023. This device consists of a triple axis preform arrangement matrix whose positions according to the first two axes correspond to the position of the mounting lands of the substrate and define the coordinates of the storage bored hole axes produced in said matrix in which the preforms are arranged. The gripping module, which has suction holes that mirror the positioning of the mounting lands, comes opposite the top end of said matrix to ensure the gripping of the preforms that are positioned and then transfers them onto a substrate. The main feature of this device for providing balls in a collective arrangement is that it is combined with a footprint-by-footprint pusher module for pushing the balls toward the top consisting of rods inserted into the bores near the bottom end of said matrix.

Although this device allows, as part of an indirect mode, an intermediate collective arrangement of the preforms, the availability of said preforms for the gripping device, that is, at the top end of the matrix, is not particularly effective. In effect, when the matrix has not been filled in optimum fashion, the number of preforms per bored holes varies. Thus, the height of the columns of preforms in each bored hole varies, which means that the initial gripping of preforms by the gripping module may not be complete, since some ends of the columns formed by the preforms will not reach the upper extremity of the matrix so that the upper ball is made available to the gripping module. Additionally, another disadvantage of this device for making balls available from a collective preform arrangement phase is that as the pusher module ensuring availability consists of rods that pin the balls to the gripping module to make them available to this module, causing mechanical stress on these balls, stress that can be the source of tiny chips or deformation of the balls. This type of deformation would consequently displace the stroke of the rods necessary to make the balls available in a single layer. Likewise, the use of metal rods adopting a footprint to footprint forward motion (the footprint corresponding to the diameter of the balls) is all the more difficult when the diameter of the balls decreases. Thus, this type of device may not be applicable for certain diameters. In general, the positioning tolerances of the rods inside the bores compared to the diameter of the balls means that this type of pusher module is difficult to use.

Another disadvantage of the device described in this document is that the arrangement matrix is not an independent device, due to the fact that this matrix has the same upper and lower extremity openings necessitating the presence of the pusher module, that is, rods at the lower end of the bored holes. This feature forces the pusher module to wait until its associated matrix is filled to be activated, and said filling thus becomes a serial operation with respect to the provision operation, which reduces the cadence of the manufacturing process using such a device. Thus, although this device uses an indirect method, it does not allow the operations to be completed in hidden time.

DESCRIPTION OF THE INVENTION

Starting from this state of affairs, the applicant conducted research whose aim was to correct the disadvantages of the devices and method cited previously in order to improve both the qualitative and the quantitative aspects of a method for transferring preforms onto a substrate.

Consequently, one target of the invention is to propose, as part of an indirect method, a device that allows certain operations to be performed in hidden time, particularly an operation consisting in causing the preforms to move from a bulk storage condition to an arranged storage condition.

Another target of the invention is to propose, still within the framework of an indirect method, an optimal solution for accomplishing the collective and simultaneous transition of a group of preforms from an ordered and stable condition inside an arrangement matrix to an ordered, stable and available state for a gripping module.

The invention also regards a device making it possible to use a method for depositing interconnection or preforms on a substrate of the type ensures the following phases:

bulk storage of the preforms, gripping of the preforms in arranged position by an adapted gripping device, depositing of the preforms on the substrate by the gripping device. This device is characterized in that it consists of at least one triple-axis arrangement matrix for preforms whose positions according to the first two axes correspond to the position of the mounting lands of the substrate and define the coordinates of the storage bored hole axes provided in said matrix in which said preforms are arranged, said bored holes being open at a first extremity so that they permit the passage of said preforms and comprising a closing method at the second extremity preventing the passage of the balls, so that a bulk preform storage module can be placed opposite the open extremities of said bores in order to fill them, said preforms abutting against said closing device at other level of said second extremity of the bored holes.

This device and the matrix characterizing it make it possible to insert between the bulk storage and gripping operations an independent collective arrangement operation for the preforms corresponding to a multiplicity of substrates, so that the gripping device performs only the motion and depositing operation, but no longer the arrangement operation. The ability to make this passage independent from the bulk storage condition to arranged storage state has the advantage of allowing this operation to be carried out in hidden time.

In effect, contrary to the device that implements the indirect method described in the prior art, the presence of a floor on the matrix or of at least one independent method of obstructing one of the extremities of the bores allows the separation of this matrix from all the other modules constituting the rest of the method or the device.

Thus, contrary to the design criteria that have prevailed until now, the applicant endeavored to physically separate the operations according to an indirect method, and to add an operation to the method already known not only so that the gripping device simply performs the gripping operation and not the arrangement operation, but also so that this added operation does not add to but, to the contrary, decreases the cycle time.

In effect, the result of this type of separation of function is that the storage and arrangement operations are performed in advance, and the gripping device performs only a gripping and depositing operation and no longer a gripping/arrangement and depositing operation. Given that the gripping/arrangement and depositing operation constitutes 90% of the cycle time of the preform transfer phase, separating the functions by inserting an independent collective arrangement phase corresponding to a multiplicity of substrates allows a considerable reduction of the time necessary for proper gripping, since the gripping device can thus perform its gripping and depositing motion very quickly.

Separating the functions and adding an additional operation therefore constitute a break with the classic conception of the transfer methods and devices that, until now, privileged, as explained in the prior art, the combination of several functions in a single and same module.

Of course, the other advantages of an added arrangement phase or operation are achieved through enhanced gripping quality as well as through the elimination of any tiny chip produced during gripping due to the fact that the gripping device catches the already-arranged preforms that are provided to the gripping device or devices as they are seized and therefore do not return to bulk storage, but remain arranged.

This device therefore makes it possible to use the maximum positioning potential of transfer machines and to order the balls in hidden time, which frees us from the positioning uncertainties and additional cycle time that this involves.

In effect, withdrawing or providing balls from an ordered and collective presentation corresponding to a multiplicity of substrates considerably reduces the risks of a shortage of balls, which makes it possible to reduce in comparable fashion the time necessary for checking and verifying that all the balls are present. In this way, we reduce the risk of not depositing a ball in a given location. We might say that the collective arrangement device presents an N times smaller risk of forgetting a ball compared to the single-arrangement devices of the prior art (N being the number of balls that may be stacked in the device).

The device of the invention is therefore the perfect adaptation for simultaneously optimizing the qualitative and quantitative aspects of a method for depositing interconnection preforms onto a substrate.

The following description of this invention given by way of non-limiting example and illustrated by drawings allows a better understanding and demonstrates other features and possibilities for this invention.

BRIEF DESCRIPTION OF THE DRAWINGS

FIG. 1 represents a technique of the prior art for transferring balls onto a substrate directly using the parallel stencil method, FIG. 2 is another technique of the prior art for transferring balls onto a substrate indirectly according to the suction gripping method.

DESCRIPTION OF THE PREFERRED MODES OF EMBODIMENT

Figure 3:
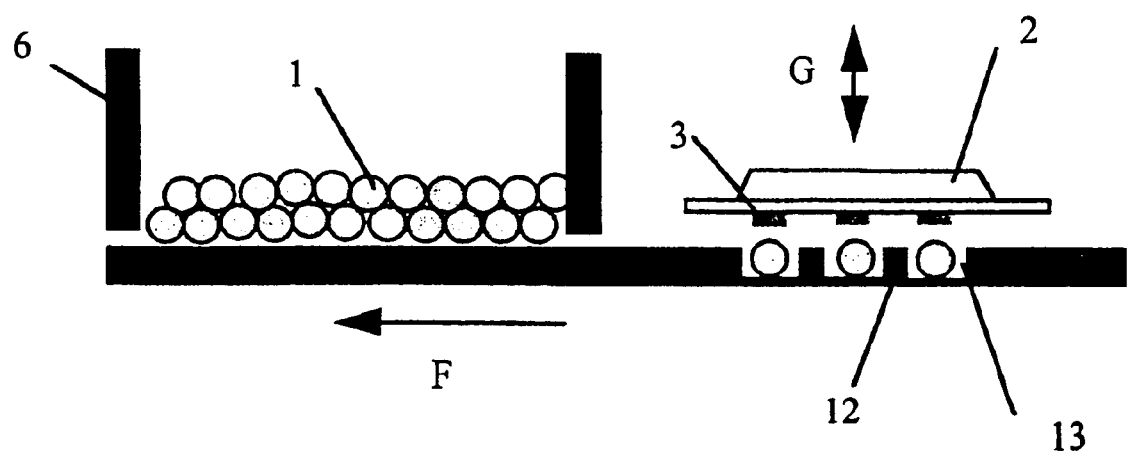
FIG. 3 shows another technique of the prior art for transferring balls onto a substrate directly according to the gravity-filled cavity method.

FIG. 1 represents the implementation of the transfer operation for balls or preforms (1) according to the prior art method using parallel stencils. Soldering flux or cream was previously deposited on the mounting lands (3) of the substrate (2). The preforms (1) are arranged in bulk in a container (6) and under the effect of gravity, the openings (8) of the first stencil (4) that are opposite the mounting lands (3) will admit a ball. When all the chambers are occupied by a ball, the second stencil (5) is moved in the direction E the value of half an interconnection footprint so that its openings (7) are aligned with the mounting lands (3) and the openings (8). In this way, the balls (1) already in the chambers (8) will fall onto the mounting lands (3). At that time, the stencil (4) is shifted one-half footprint in the opposite direction of E and the substrate having received the balls (2) is removed and replaced by another substrate (2), and so on.

FIG. 2 shows the implementation of the operation for transferring balls indirectly according to the suction gripping method, as used in the prior art. A gripping device (9) with preformed pockets each connected to a suction source and whose positioning mirrors the corresponding imprint on the substrate to receive the balls (2) withdraws balls (1) arranged in bulk fashion in a container (6). Then the balls withdrawn are dipped in the flux (10) that has been evened out with a spatula (11). To finish, the flux-dipped balls (1) are deposited on the substrate (2).

In FIG. 3, we see the implementation of the operation for transferring balls according to the gravity-filled cavity method as used in the prior art. A slide (12) with pockets (13) that correspond to the mounting lands of the substrate is positioned in initial state so that the slots (13) are located below the bulk container (6) filled with balls (1). When each pocket contains a ball, the slide is moved in the opposite direction to F so that the filled pockets are opposite the substrate that is to receive the balls that has previously received deposits of soldering flux. The balls present in the pockets (13) are withdrawn by a reciprocating motion G, then the operation is repeated for a new substrate.

While the three preceding techniques are simple to use, they all have the disadvantage of being limited in frequence, since it is necessary to order the balls from their bulk presentation for each transfer operation. Consequently, the time necessary to order the balls during the transfer cycle is particularly disadvantageous since it is not uncommon to have to repeat the operation several times by applying vibrations so that all the pockets are occupied by a ball. Furthermore, to offset faulty gripping or poor filling of cavities, it is necessary to perform a routine presence check for all preforms on the substrate under penalty of an unacceptable level of quality, which increases the cycle time.

Figure 4:
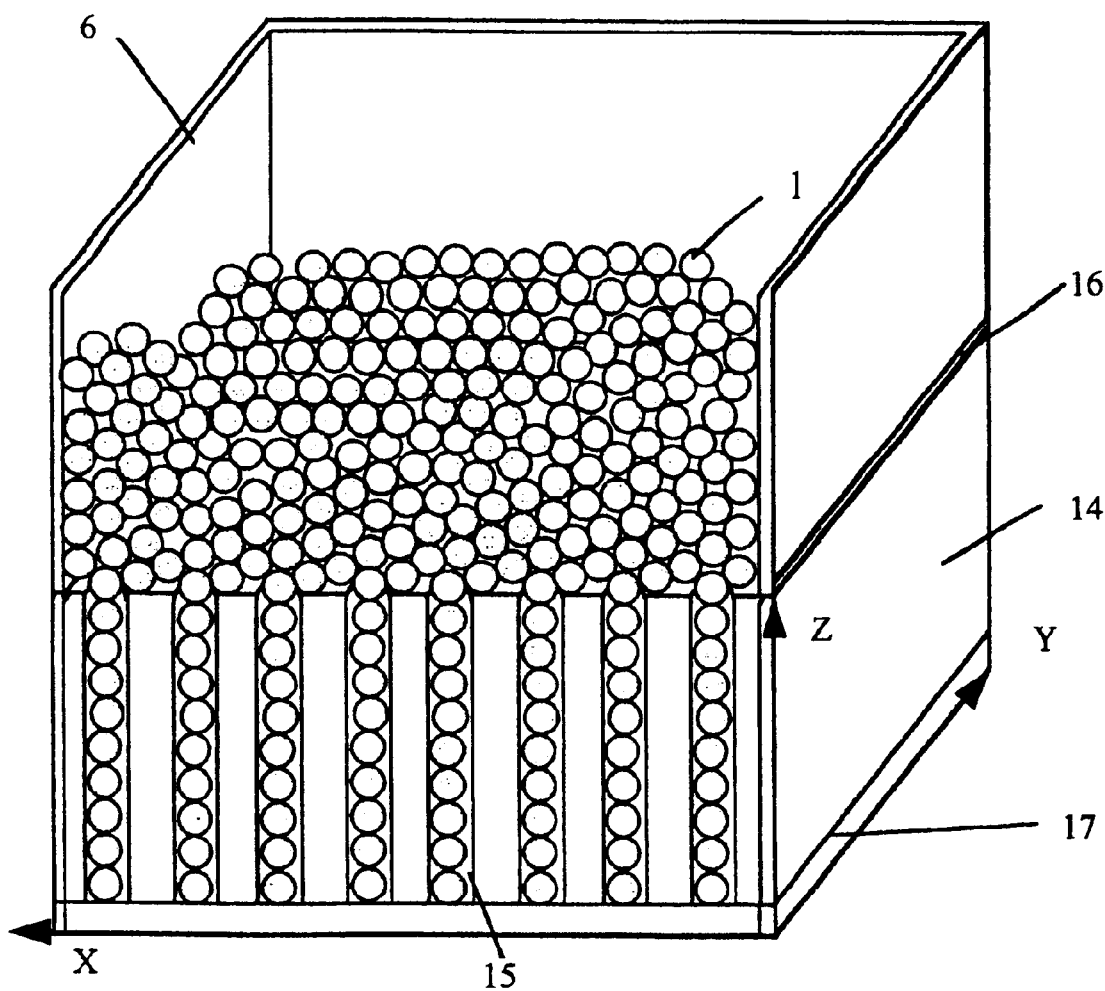
FIG. 4 is a cross-section view of a mode of embodiment of the collective arrangement device targeted by this invention during the filling phase.

FIG. 4 is a cross-section representation of a device (14) according to this invention during its loading phase from a bulk ball container (6). The device (14) is a matrix whose positions X and Y correspond to the mounting lands of the substrate receiving the balls. To each of these positions corresponds a bored hole (15) perpendicular to the plane X Y and that is parallel to the plane of the substrate receiving the balls. As illustrated, the device consists of a matrix in which the depth of the bored holes (15) makes it possible to store a multiplicity of preforms.

The bored holes (15) have a diameter that corresponds to the diameter of the balls plus a working clearance that allows the balls to slide freely according to the axis Z, but sufficiently small so that the balls remain stacked one on top of the other. The device (14) is filled with balls from the container (6) by gravity, the lower face (17) of the matrix making up the device (14) being closed. When the device is filled, the full device (14) is replaced by another empty device. Effectively, it must be clearly understood that the container (6) making up the storage module is positioned selectively above the device (14) and separated from it once the matrix is filled, contrary to the devices of the prior art that use direct transfer methods whose main features reside more particularly in the permanent association of a matrix with the storage module or to the devices implementing indirect transfer methods whose main features reside more particularly in the permanent association of a matrix with a pusher module.

The devices can therefore be filled in hidden time and under these circumstances, each device can be made refillable packaging making it possible to incorporate balls on N substrates, N being the number of balls that can be stacked in the device. The filling operation may be accomplished at an autonomous station capable to supply several transfer machines.

It is also conceivable to have the balls delivered directly packaged in devices by the supplier, and in this case, one will use a removable cover (not shown) to close the face (16) during handling.

Figure 6A:
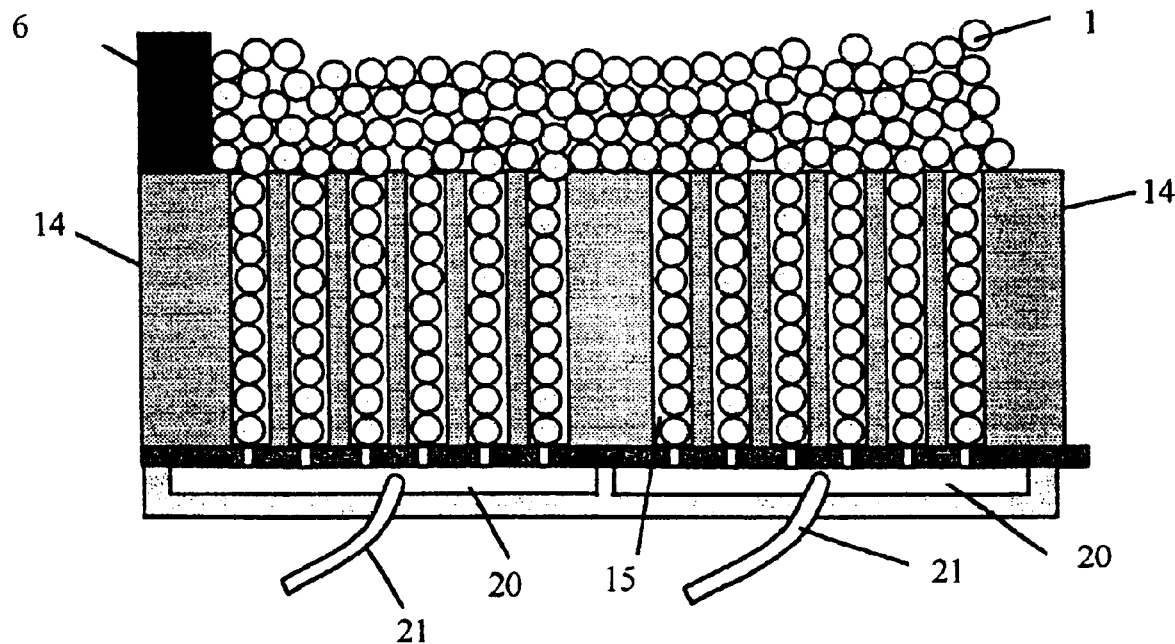
FIG. 6a is a cross-section view of another mode of embodiment of the device of the invention during the filling phase.
Figure 6B:
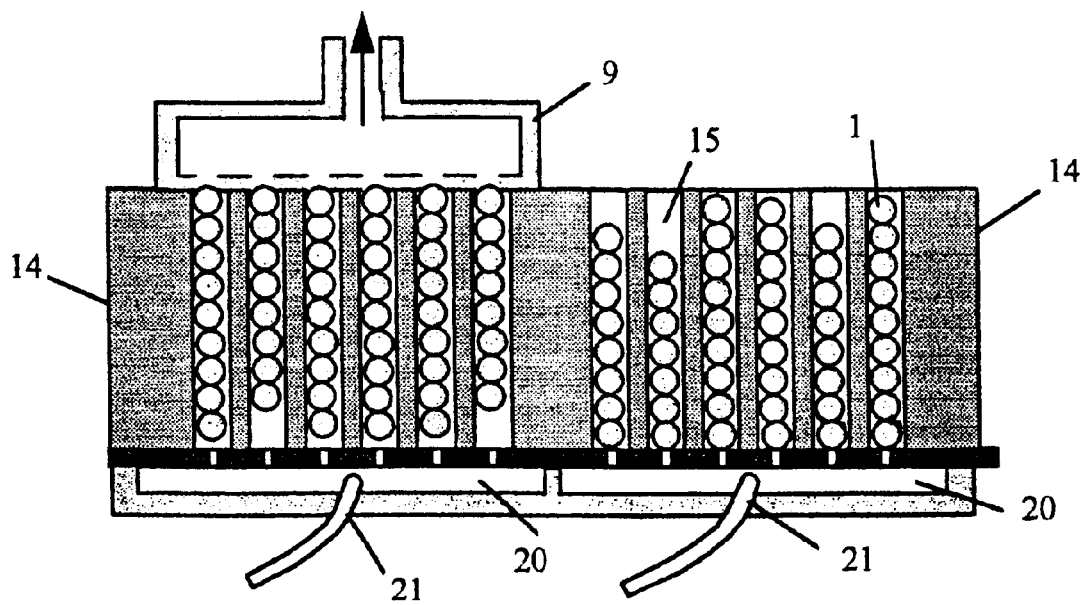
FIG. 6b is a cross-section view of the mode of embodiment of the device in FIG. 6a during the ball placement phase.

According to another particularly advantageous feature of the invention constituting a second target of the aforementioned invention illustrated in FIGS. 6a and 6b, the device (14) consists of at least one matrix in which the depths of the bores (15) allows storage of a multiplicity of preforms (1), said bored holes (15) include a first open extremity with which the gripping areas of said gripping device (9) come face to face and a second extremity with a pusher module for pushing said preforms (1) toward the gripping area, said pusher module consisting of a compressed fluid inlet ensuring at least a selective push against the arranged preforms (1) so that all the preforms (1) arranged in each bored hole (15), are moved by a forward motion bringing the preform (1) closest to the first extremity into contact with the corresponding gripping area of the gripping device (9) when said gripping device is moved in front of it in order to present successive layers of preforms (1) as they are gripped.

Contrary to the devices of the prior art that rely on rigid rods, this mode of embodiment also makes available a layer of preforms at the first extremity regardless of the number of preforms (1) present in the bored holes (15) and therefore regardless of the height formed by the preforms. This feature makes it possible to disregard the minimum tolerance required in the case of a footprint to footprint advancement of the preforms, which facilitates and reduces the cost of the pusher module.

As illustrated in FIG. 6a, the bored holes (15) of the devices (14) are filled by gravity by their free extremities by means of a storage module (6). As illustrated, with each device (14) is associated at the second end of the bored holes (15) a pusher chamber (20) fed by a nozzle (21). These same second extremities are constricted, by means of an attached plate constituting the closing method provided opposite each bored hole (15), by a bored hole with a smaller diameter that allows a fluid to pass but maintains the preforms in the bored holes (15) of the matrix formed by the device (14). Thus, here the closing method of said second extremity of the bored holes (15) allows a fluid to pass but not the preforms (1).

As illustrated in FIG. 6b, when the gripping device (9) arrives opposite the first open extremity of the bored holes (15) provided in the matrix, a jet of fluid (for example air) is expelled from the nozzle (21) connected to the chamber (20) located below the matrix opposite the gripping device, which provides the chambers of the gripping device with a preform (1) regardless of the number of preforms present in each bored hole.

Figure 8A:
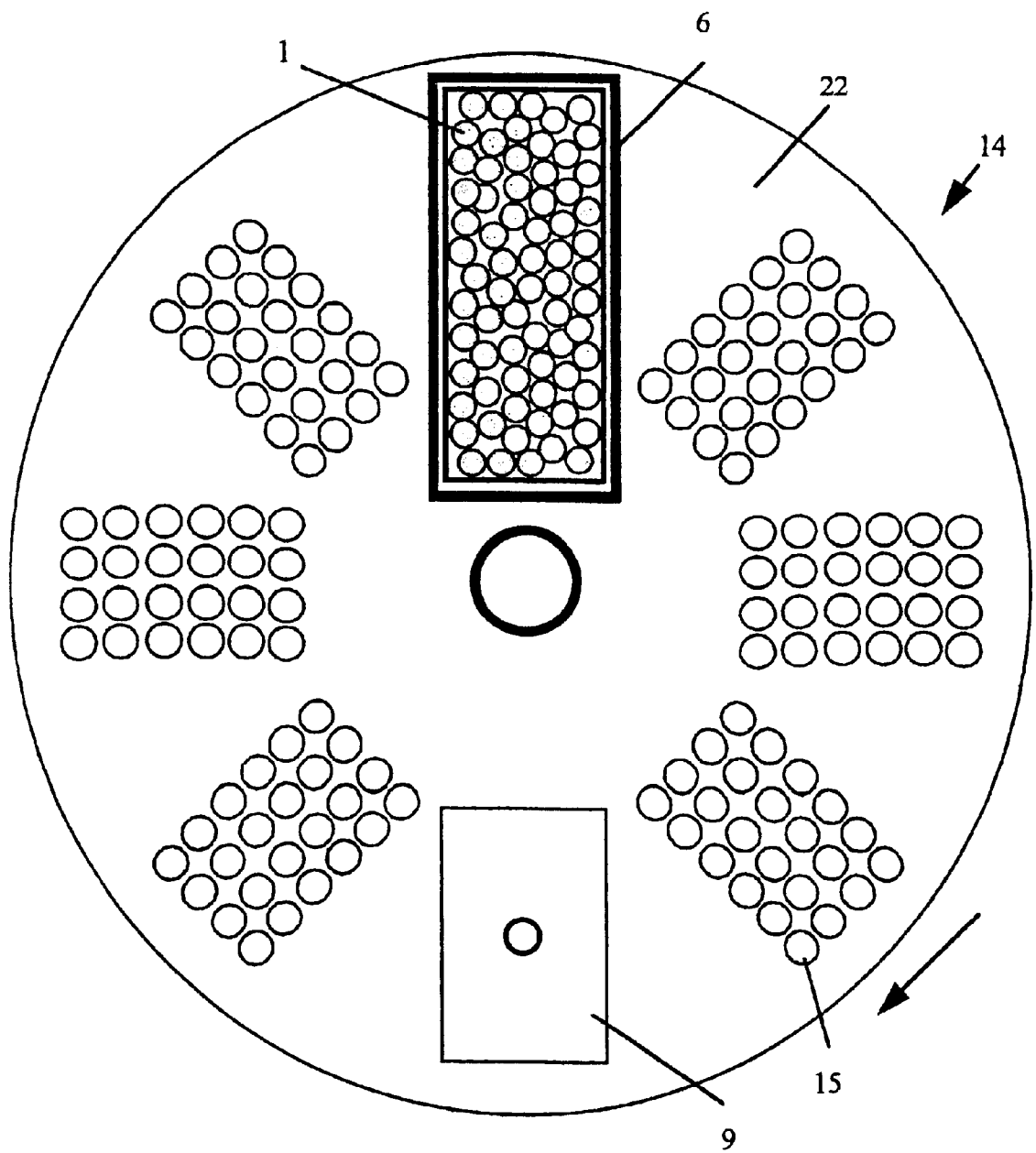
FIG. 8a is a top view of another mode of embodiment of the device for providing balls.
Figure 8B:
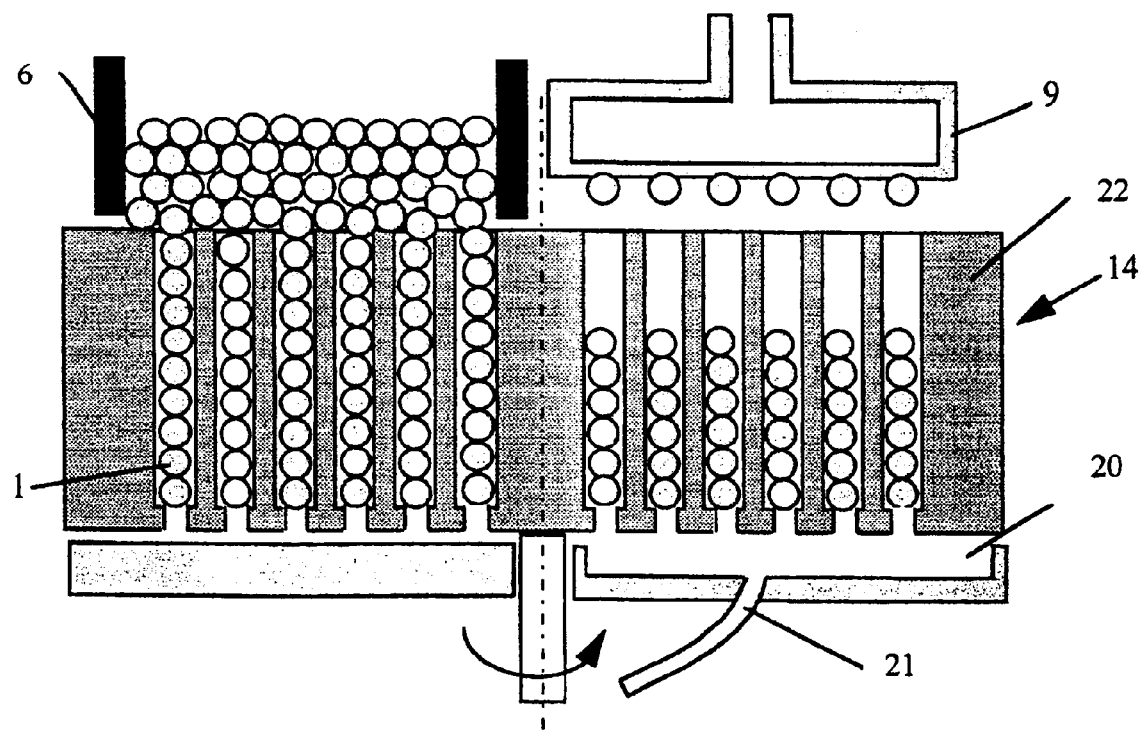
FIG. 8b is a cross-sectional view of the mode of embodiment of FIG. 8a, FIG. 8c is another cross-section view of the mode of embodiment of FIG. 8a illustrating another possibility for this mode of embodiment.

The design of this type of pusher module makes it possible to envision the particularly advantageous mode of embodiment illustrated by FIGS. 8a and 8b.

According to this mode of embodiment, the device (14) advantageously consists of:
  a multiplicity of matrices laid out at regular angular intervals on a rotary plate,
  at least one filling station supplied by a bulk preform (1) storage bin (6) that comes opposite the first extremities of the bores (15) of the matrices passing underneath,
  at least one gripping station manned by a gripping module (9) whether or not it is associated with a pusher module, the plate (22) moving in an angular footprint to footprint rotation in order to cause the empty matrices to pass the filling station and the filled matrices to pass the gripping station.

Although here the closing method is made up of bored holes whose second extremities terminate in constrictions that let the air pass but not the balls, the applicant has advantageously imagined that in an evolution of this mode of embodiment, said plate (22) is associated with a stationary disk that, as the disk rotate, closes the second extremity of the bored holes (15) thereby constituting a total closing method during the filling phase and partial closing during the gripping phase in order to make said second extremities correspond with said chambers (20) and to allow a fluid to lift the preforms (1) inside their storage bored hole (15) in order to make the preforms available to the gripping device that arrives opposite the first extremities as gripping takes place. According to the mode of embodiment illustrated, a stationary storage module (6) is placed 180° from the gripping station. Still within the framework of the evolution described above, said stationary plate can be preformed with windows allowing the balls to pass through the second extremity, thereby creating a purge phase for the matrices just used in gripping mode. This purge phase is all the more important since the user of the device may envision, for safety reasons, performing n gripping of the available layers of preforms in the matrix, n corresponding to a number lower than N, the number of layers capable of being hosted in optimum fashion by the matrix.

Figure 5:
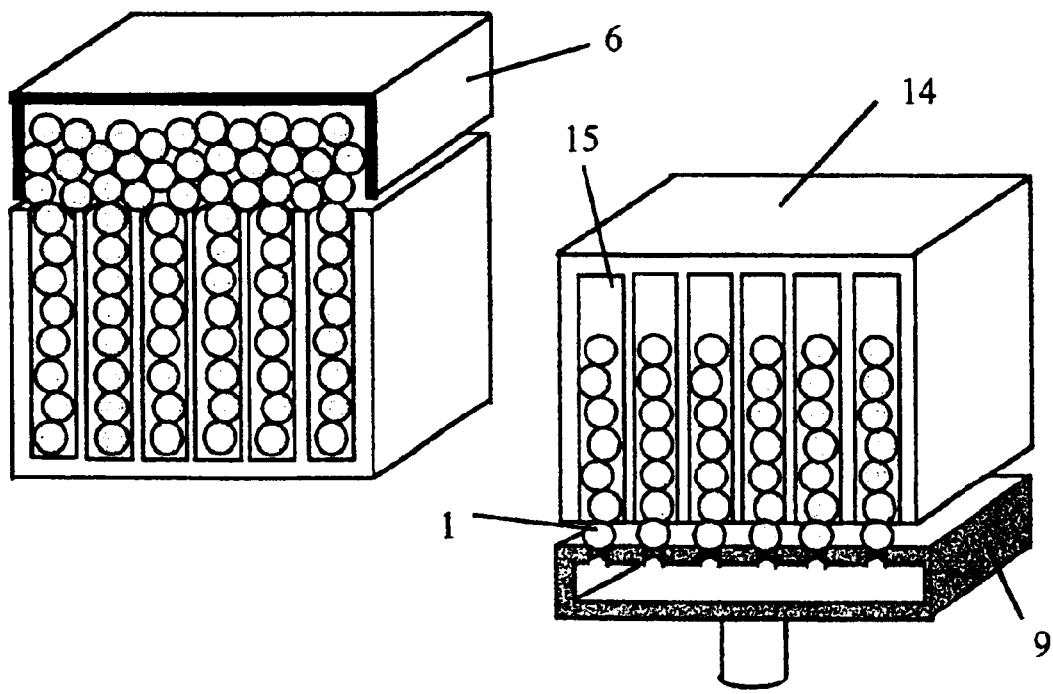
FIG. 5 shows another option for using the device according to the invention, particularly suited for replacing balls on components during repairs.
Figure 5:
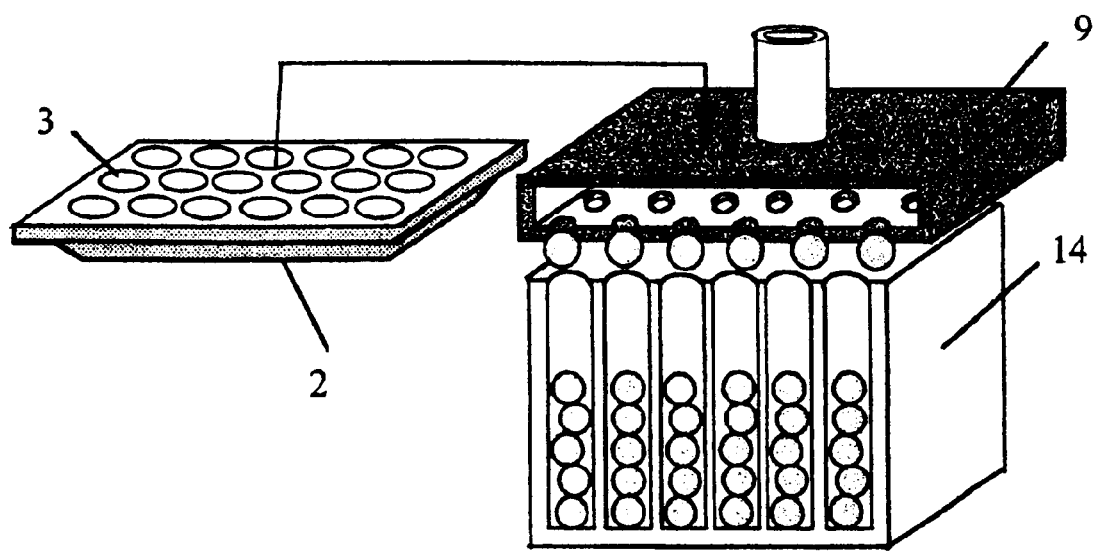

FIG. 5 illustrates another form of implementation of the device (14) according to the invention that is particularly suited to replacing balls on components in connection with repair work. In fact, the implementation shown in FIG. 5 is a combination of the suction technique and the gravity technique, both described previously.

As a first step, we see the device (14), the target of the invention, whose said bored hole (15) in this case comprise a first open extremity opposite which are placed the gripping areas of said gripping device and a second closed extremity, with bored holes (15) that do not open onto one of the two faces and that contains preforms (1). The function of the system of closing is ensured here by the fact that the bored holes have been machined without going through the matrix. The same function could have been produced by a matrix with holes all the way through and closed at one extremity by a plate, as illustrated in FIG. 4. The device (14) is filled by gravity from a container (6) of balls stored in bulk. When the collective arrangement device (14) is completely full, the container (6) is removed along with any excess balls located on the open surface of the device. At this time, the open surface is covered by the suction gripping device (9) and both (14) and (9) are inverted at the same time.

As a second step, we see the device (14) in inverted position so that the balls contained in the obstructed bored holes (15) fall by gravity into the cavities of the suction gripping device (9). When all the positions are occupied by a ball, the unit (device plus gripping device) is inverted a second time while maintaining suction. As shown in FIG. 6, all the balls remaining fall via gravity into the bottom of the bored holes (15) while those maintained in the gripping device (9) by suction can be deposited on the mounting lands (3) of the substrate (2). This operation can be repeated N times, N being the number of balls that can be stacked in the blind bored holes (15).

Figure 7A:
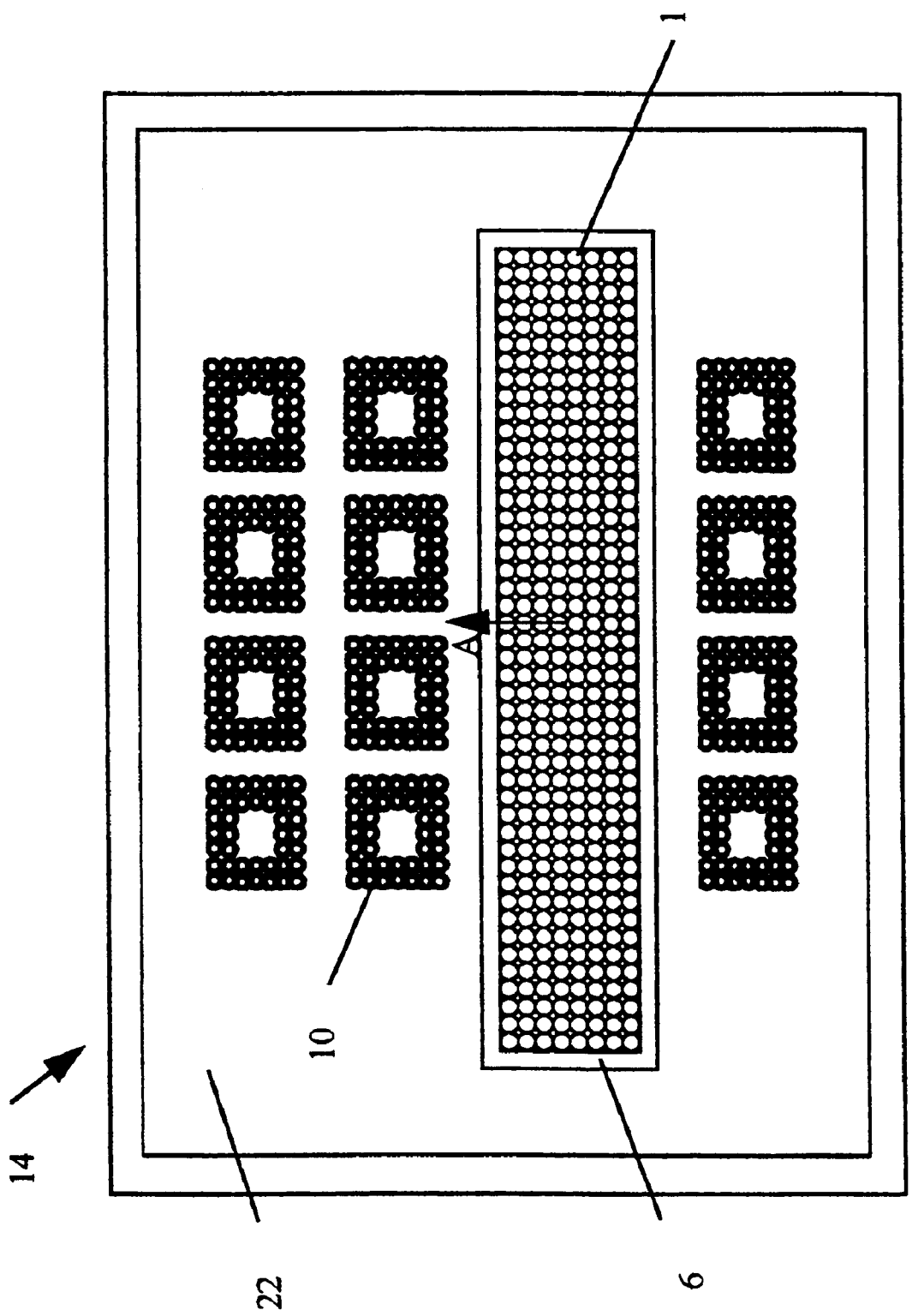
FIG. 7a is a top view of another mode of embodiment of the device of the invention for providing balls during the filling phase.
Figure 7B:
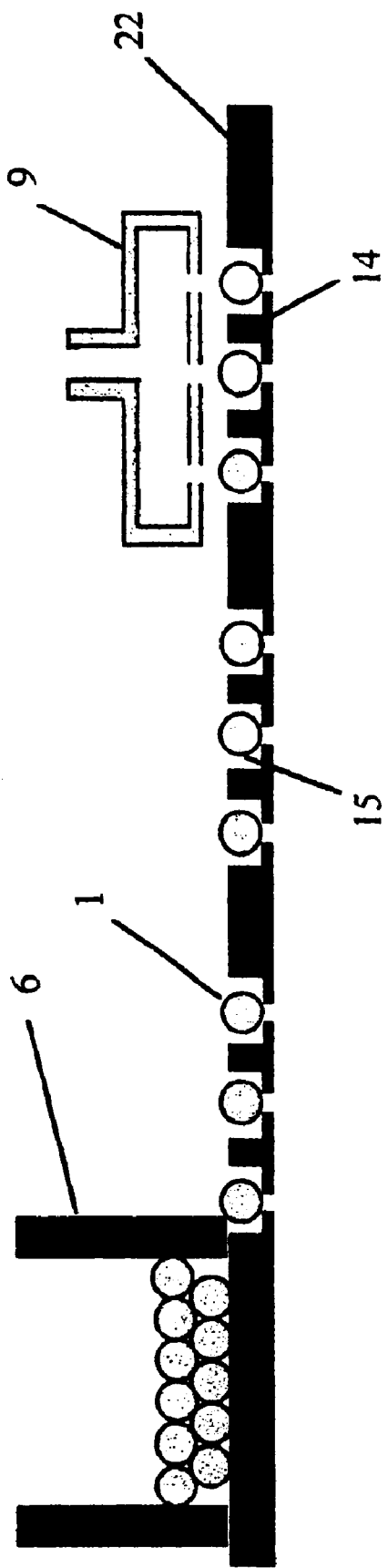
FIG. 7b is a section view of the mode the embodiment of FIG. 7a during the ball availability phase.

Another mode of embodiment of the device of the invention using a matrix equipped with bored holes (15) at least partially obstructed at one extremity is illustrated in FIGS. 7a and 7b. In this mode of embodiment, the device (14) consists of a multiplicity of matrices in which the depth of the bored holes (15) allows them to store a single preform (1) per bored hole (15).

This mode of embodiment has the advantage of avoiding all the devices and methods necessary for the continuous feeding of preforms stored inside a bored hole such as the thruster module mentioned earlier. Arrangement by means of a transfer from the storage module (6) to the devices (14) for the purposes of filling said modules (15) that can contain only one preform is conceivable only when the gripping and depositing operation is performed by another independent module allowing completion of said operation in hidden time. Only an indirect method can accommodate this type of operation.

The device (14) is characterized here in that it consists of a plate (22) comprising a multiplicity of matrices arranged according to a flat layout guide and by a filling module (6) covering several matrices with its surface in contact with said plate (22) and passing over these matrices in order to fill them, a gripping device module then grips the preforms (1) according to a motion corresponding to the layout guide of said matrices.

As illustrated in FIG. 7a, a bulk preform (1) storage module (6) is applied on top of a device (14) comprising a multiplicity of matrices, filling being accomplished by gravity. Once each bored hole is filled, a gripping device (9) takes the preforms already arranged in order to deposit them on a substrate.

This mode of embodiment is, in fact, the horizontal evolution of the preceding mode of embodiment describing bored holes (15) capable of containing N preforms. Here, the device (14) consists of N matrices, but resolves the aforementioned disadvantages and does not increase the cycle time, since the filling operations are accomplished in hidden time and since the motion of the gripping device module (9) can normally be programmed and are extremely fast.

As illustrated in this mode of embodiment, the second extremity of said bored holes (15) is closed in order to retain said preforms (1) while allowing air to pass. Although this mode of embodiment does not require the use of a pusher module, the passage of air allows the preform to be sucked up by the gripping device while the absence of any opening at the second extremity could result in the creation of a vacuum in the bored hole without gripping the preform (1).

Figure 8C:
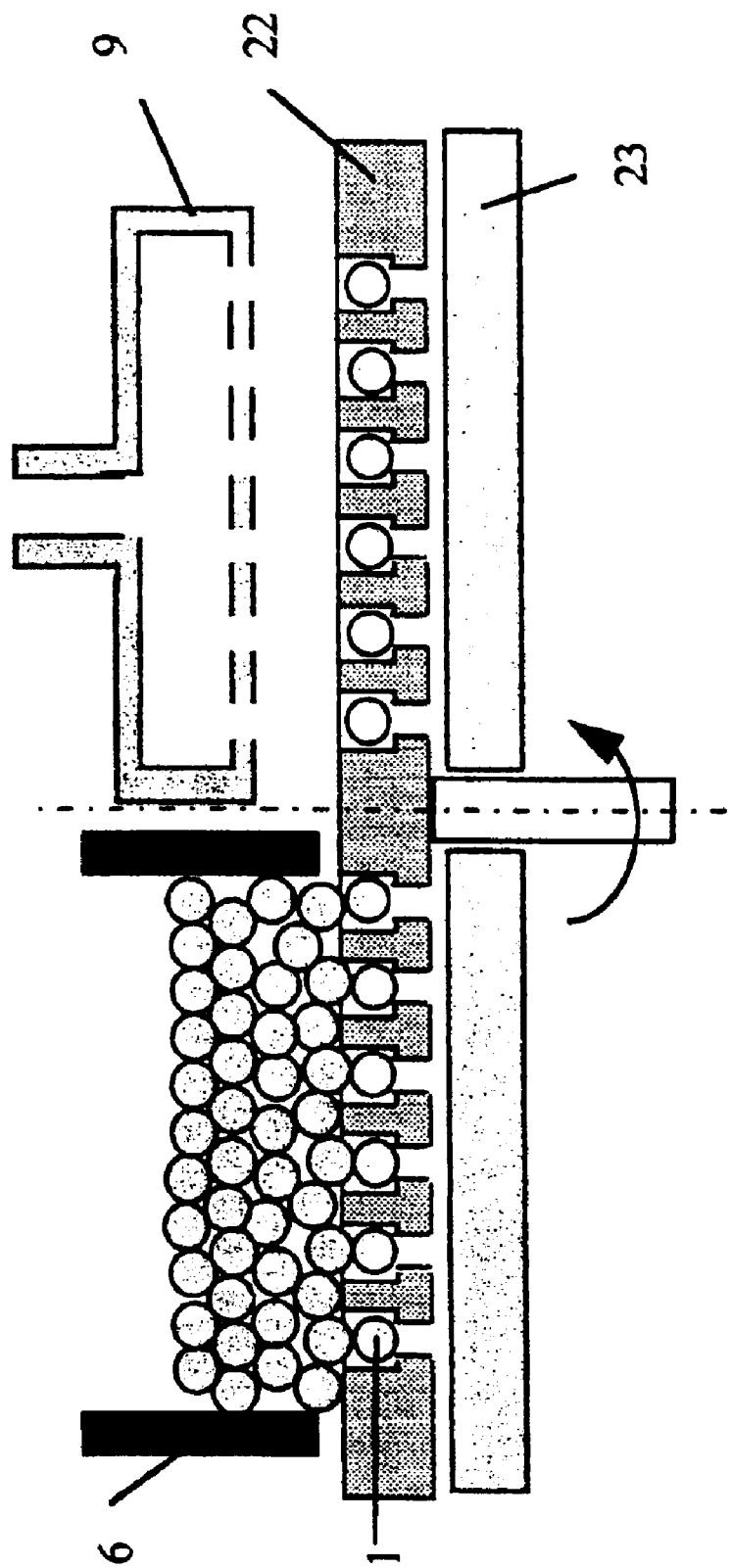

Here, too, the mode of embodiment of the device using a rotary plate can be adapted and is illustrated by FIGS. 8a and 8c.

In order to minimize the number of collective arrangement devices necessary, it is possible to use the same devices for all the components having the same interconnection footprint; in this case, it suffices to insert a thin mask pierced with holes at the locations requiring the passage of the desired balls between the gripping device and the device of the invention. Another option may consist of a specific gripping device for each application.

The device according to the invention makes it possible to limit considerably the need for checking the presence of all the balls after each transfer operation. With this device, it is entirely possible to check for the presence of all the balls once per device either at the first cycle or at the last cycle, since during the intermediate phases the risk of having a missing ball is negligible.

It is understood that the device described above and represented has been described and represented for the purposes of disclosure rather than limitation. Of course, various accommodations, modifications and improvements can be made to the example given above without departing from the scope of the invention claimed taken in its broadest aspects and spirit.

Thus, for example, the applicant does not wish to limit himself to a single type of preform and anticipates that the method is adaptable to all types, more particularly cylindrical preforms.

What is claimed is:

1. Device (14) for depositing preforms (1) on a substrate (2), at predefined locations corresponding to mounting lands on the substrate, the device ensuing the following phases:

bulk storage of the preforms (1), gripping of the preforms in arranged position (1) by an adapted gripping device (9), depositing of the preforms (1) on the substrate (2) by the gripping device (9), WHEREIN the device comprises at least one triple-axis arrangement matrix for preforms (1) having storage holes (15) therein, the storage holes being positioned, according to the first two axes of said triple-axis arrangement matrix, at coordinates corresponding to the position of the mounting lands of the substrate, said storage holes being open at a first extremity in order to allow the passage of said preforms therethrough and having a closure at a second extremity which does not allow the passage of said preforms therethrough, each storage hole being sized to accept at least one preform therein, and a pusher module operable to push the preforms toward the gripping area, said bulk storage is provided by a bulk preform storage module (6), said bulk preform storage module and said triple-axis arrangement matrix being locatable relative to each other at a first position wherein the bulk storage module is engaged with the open first extremities of said storage holes (15) in order to fill the storage holes and being locatable relative to each other at a second position wherein the bulk storage module is not engaged with the open first extremities of the storage holes and the gripping device (9) is engaged with the open first extremities of the storage holes, and in said first position the pusher module and the triple-axis arrangement matrix are not operatingly engaged with each other and in said second position the pusher module is operatingly engaged with the triple-axis matrix at the second extremities of the storage holes.

2. Device (14) as claimed in claim 1, WHEREIN said second extremity closure allows the passage of a fluid therethrough.

3. Device (14) as claimed in claim 1, WHEREIN the device comprises a multiplicity of said triple-axis arrangement matrices in which the depth of the holes (15) allows them to store a single preform (1) per hole (15).

4. Device (14) as claimed in claim 1, WHEREIN the device comprises at least one said triple-axis arrangement matrix in which the depth of the holes (15) allows the storage of a multiplicity of said preforms (1) and, when said triple-axis arrangement matrix is in said second position, gripping areas of said gripping device (9) are aligned with said first open extremities of said storage holes and said pusher module comprises a compressed fluid inlet applying at least selective push to the arranged preforms (1) so that all of the preforms (1) arranged in each storage hole (15) are activated by a forward motion bringing the preform (1) closest to the first extremity in contact with the corresponding gripping area of the gripping device (9) when the gripping device is positioned in front of it in order to present successive layers of performs (1) as they are gripped.

5. Device (14) as claimed in claim 1, WHEREIN the device comprises a multiplicity of said triple-axis arrangement matrices arranged at a regular angular interval on a rotary plate (22), said bulk preform storage module comprises at least one filling station supplied by a storage bin containing bulk preforms (1) positioned opposite the first extremities of the holes (15) of the matrices passing underneath, and said gripping device comprising at least one gripping station, the rotary plate (22) revolving in an angular footprint to footprint rotation in order to cause the empty matrices to pass by the filling station and the filled matrices to pass by the gripping station.

6. Device (14) as claimed in claim 1, WHEREIN the device comprises a plate (22) comprising a plurality of said triple-axis arrangement matrices arranged according to a flat layout guide and said bulk preform storage module comprises a filling module (6) covering several triple-axis arrangement matrices with its surface in contact with said plate (22) and passing above these matrices in order to fill them, the gripping device then gripping the preforms (1) according to a motion corresponding to the layout guide for said matrices.

7. Device (14) as claimed in claim 1, WHEREIN a thin mask is inserted between the gripping device and the first extremity of certain storage holes (15) for the purposes of adapting the matrix to the corresponding gripping devices (9) and/or substrates (2), having the same interconnection footprint, but using a different layout.

8. Device (14) as claimed in claim 2, WHEREIN the device comprises at least one said triple-axis arrangement matrix in which the depth of the holes (15) allows the storage of a multiplicity of said preforms (1), when said triple-axis arrangement matrix is in said second position, gripping areas of said gripping device (9) are aligned with said first open extremities of said storage holes and said pusher module comprises a compressed fluid inlet applying at least selective push to the arranged preforms (1) so that all of the preforms (1) arranged in each storage hole (15) are activated by a forward motion bringing the preform (1) closest to the first extremity in contact with the corresponding gripping area of the gripping device (9) when the gripping device is positioned in front of it in order to present successive layers of performs (1) as they are gripped.

9. Device (14) as claimed in claim 8, WHEREIN the device comprises a multiplicity of said triple-axis arrangement matrices arranged at a regular angular interval on a rotary plate (22), said bulk preform storage module comprises at least one filling station supplied by a storage bin containing bulk preforms (1) positioned opposite the first extremities of the holes (15) of the matrices passing underneath, and said gripping device comprising at least one gripping station, the rotary plate (22) revolving in an angular footprint to footprint rotation in order to cause the empty matrices to pass by the filling station and the filled matrices to pass by the gripping station.

10. Device (14) as claimed in claim 3, WHEREIN the multiplicity of said triple-axis arrangement matrices are arranged at a regular angular interval on a rotary plate (22), said bulk preform storage module comprises at least one filling station supplied by a storage bin containing bulk preforms (1) positioned opposite the first extremities of the holes (15) of the matrices passing underneath, and said gripping device comprises at least one gripping station, the rotary plate (22) revolving in an angular footprint to footprint rotation in order to cause the empty matrices to pass by the filling station and the filled matrices to pass by the gripping station.

11. Device (14) as claimed in claim 4, WHEREIN the device comprises a multiplicity of said triple-axis arrangement matrices arranged at a regular angular interval on a rotary plate (22), said bulk preform storage module comprises at least one filling station supplied by a storage bin containing bulk preforms (1) positioned opposite the first extremities of the holes (15) of the matrices passing underneath, and said gripping device comprises at least one gripping station, the rotary plate (22) revolving in an angular footprint to footprint rotation in order to cause the empty matrices to pass by the filling station and the filled matrices to pass by the gripping station.

12. Device (14) as claimed in claim 2, WHEREIN the device comprises a plate (22) comprising a plurality of said triple-axis arrangement matrices arranged according to a flat layout guide and said bulk preform storage module comprises a filling module (6) covering several triple-axis arrangement matrices with its surface in contact with said plate (22) and passing above these matrices in order to fill them, the gripping device then gripping the preforms (1) according to a motion corresponding to the layout guide for said matrices.

13. Device (14) as claimed in claim 3, WHEREIN said triple-axis arrangement matrices are arranged according to a flat layout guide and said bulk preform storage module comprises a filling module (6) covering several triple-axis arrangement matrices with its surface in contact with said plate (22) and passing above these matrices in order to fill them, the gripping device then gripping the preforms (1) according to a motion corresponding to the layout guide for said matrices.

14. Device for depositing preforms on a substrate, at predefined locations corresponding to a first pattern of mounting lands on the substrate, the device ensuring the following phases:

bulk storage of the preforms provided by a bulk storage module, gripping of the preforms in arranged position by an adapted gripping device, depositing of the preforms on the substrate by the gripping device, the device comprising:

at least one triple-axis arrangement matrix for preforms having storage holes therein, the storage holes being positioned, according to the first two axes of said triple-axis arrangement matrix, at coordinates corresponding to the position of the mounting lands of the substrate and the triple-axis arrangement matrix adapted to receive preforms from the bulk storage module and to present them in arranged position to the gripping device, and a thin mask interposable between the gripping device and the first extremity of certain storage holes for the purposes of adapting the matrix to a second pattern of mounting lands having the same interconnection footprint, but using a different layout.

* * * * *